(12) United States Patent
Frougier et al.

(10) Patent No.: US 12,211,848 B2
(45) Date of Patent: Jan. 28, 2025

(54) FIELD EFFECT TRANSISTORS COMPRISING A MATRIX OF GATE-ALL-AROUND CHANNELS

(71) Applicant: International Business Machines Corporation, Armonk, NY (US)

(72) Inventors: Julien Frougier, Albany, NY (US); Ruilong Xie, Niskayuna, NY (US); Kangguo Cheng, Schenectady, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 591 days.

(21) Appl. No.: 17/384,416

(22) Filed: Jul. 23, 2021

(65) Prior Publication Data

US 2023/0027293 A1 Jan. 26, 2023

(51) Int. Cl.
*H01L 27/092* (2006.01)
*H01L 21/02* (2006.01)
(Continued)

(52) U.S. Cl.
CPC ...... *H01L 27/092* (2013.01); *H01L 21/02532* (2013.01); *H01L 21/02603* (2013.01);
(Continued)

(58) Field of Classification Search
CPC ............ H01L 27/092; H01L 21/02532; H01L 21/02603; H01L 21/28088; H01L 21/30604; H01L 21/76897; H01L 21/823807; H01L 21/823814; H01L 21/823842; H01L 21/823871; H01L 21/823878; H01L 29/0673; H01L 29/41733; H01L 29/42392; H01L 29/4908; H01L 29/66439; H01L 29/66545; H01L 29/66553; H01L 29/66742; H01L 29/775; H01L 29/78618; H01L 29/78696
See application file for complete search history.

(56) References Cited

U.S. PATENT DOCUMENTS 9,196,613 B2  11/2015  Basker et al.
9,614,056 B2   4/2017  Xie et al.
(Continued)

*Primary Examiner* — Matthew E. Gordon
*Assistant Examiner* — Sean Ayers Winters
(74) *Attorney, Agent, or Firm* — Yee & Associates, P.C.

(57) ABSTRACT

Provided is a semiconductor structure with shared gated devices. The semiconductor structure comprises a substrate and a bottom dielectric isolation (BDI) layer on top of the substrate. The structure further comprises a pFET region that includes a p-doped Source-Drain epitaxy material and a first nanowire matrix above the BDI layer. The structure further comprises an nFET region that includes a n-doped Source-Drain epitaxy material and a second nanowire matrix above the BDI layer. The structure further comprises a conductive gate material on top of a portion of the first nanowire matrix and the second nanowire matrix. The structure further comprises a vertical dielectric pillar separating the pFET region and the nFET region. The vertical dielectric pillar extends downward through the BDI layer into the substrate. The vertical dielectric pillar further extends upward through the conductive gate material to a dielectric located above the gate region.

17 Claims, 16 Drawing Sheets

(51) Int. Cl.

| | |
|---|---|
| *H01L 21/28* | (2006.01) |
| *H01L 21/306* | (2006.01) |
| *H01L 21/768* | (2006.01) |
| *H01L 21/8238* | (2006.01) |
| *H01L 29/06* | (2006.01) |
| *H01L 29/417* | (2006.01) |
| *H01L 29/423* | (2006.01) |
| *H01L 29/49* | (2006.01) |
| *H01L 29/66* | (2006.01) |
| *H01L 29/775* | (2006.01) |
| *H01L 29/786* | (2006.01) |

(52) U.S. Cl.
CPC .. *H01L 21/28088* (2013.01); *H01L 21/30604* (2013.01); *H01L 21/76897* (2013.01); *H01L 21/823807* (2013.01); *H01L 21/823814* (2013.01); *H01L 21/823842* (2013.01); *H01L 21/823871* (2013.01); *H01L 21/823878* (2013.01); *H01L 29/0673* (2013.01); *H01L 29/41733* (2013.01); *H01L 29/42392* (2013.01); *H01L 29/4908* (2013.01); *H01L 29/66439* (2013.01); *H01L 29/66545* (2013.01); *H01L 29/66553* (2013.01); *H01L 29/66742* (2013.01); *H01L 29/775* (2013.01); *H01L 29/78618* (2013.01); *H01L 29/78696* (2013.01)

(56) References Cited

U.S. PATENT DOCUMENTS

| | | | |
|---|---|---|---|
| 9,960,077 | B1 | 5/2018 | Zang et al. |
| 9,984,936 | B1* | 5/2018 | Xie .................... H01L 29/66439 |
| 10,177,037 | B2 | 1/2019 | Zang et al. |
| 10,192,867 | B1 | 1/2019 | Frougier et al. |
| 10,290,549 | B2 | 5/2019 | Xie et al. |
| 10,361,269 | B2 | 7/2019 | Yeung et al. |
| 10,381,459 | B2 | 8/2019 | Xie et al. |
| 10,510,620 | B1* | 12/2019 | Chanemougame .......................... H01L 27/0924 |
| 10,658,481 | B1 | 5/2020 | Zhang et al. |
| 10,840,329 | B1 | 11/2020 | Xie et al. |
| 11,049,934 | B2 | 6/2021 | Razavieh et al. |
| 2019/0288117 | A1 | 9/2019 | Xie et al. |
| 2019/0371887 | A1* | 12/2019 | Frougier ............... H01L 29/401 |
| 2020/0006340 | A1* | 1/2020 | Lilak .................. H01L 29/78696 |
| 2020/0105755 | A1* | 4/2020 | Cea .................... H01L 29/78654 |
| 2021/0036121 | A1* | 2/2021 | Lim .................. H01L 29/78696 |

* cited by examiner

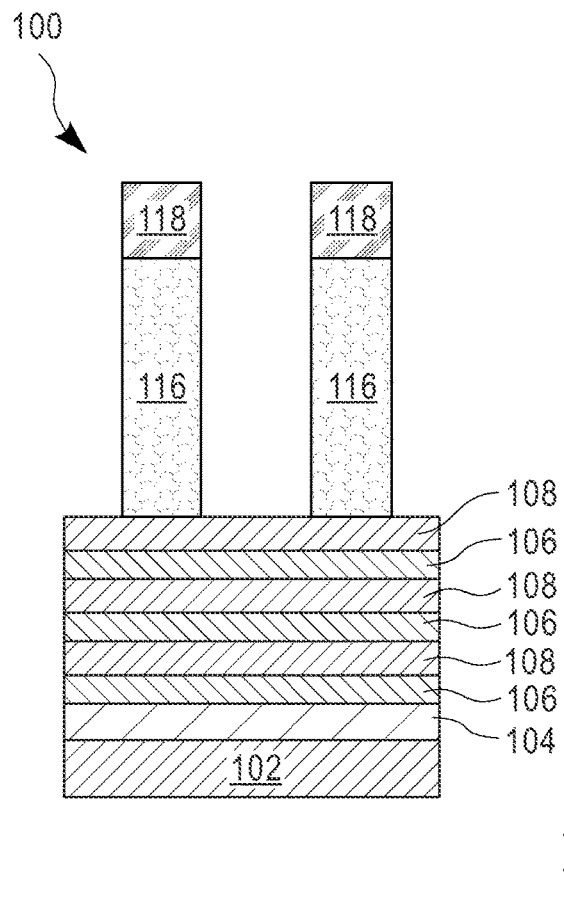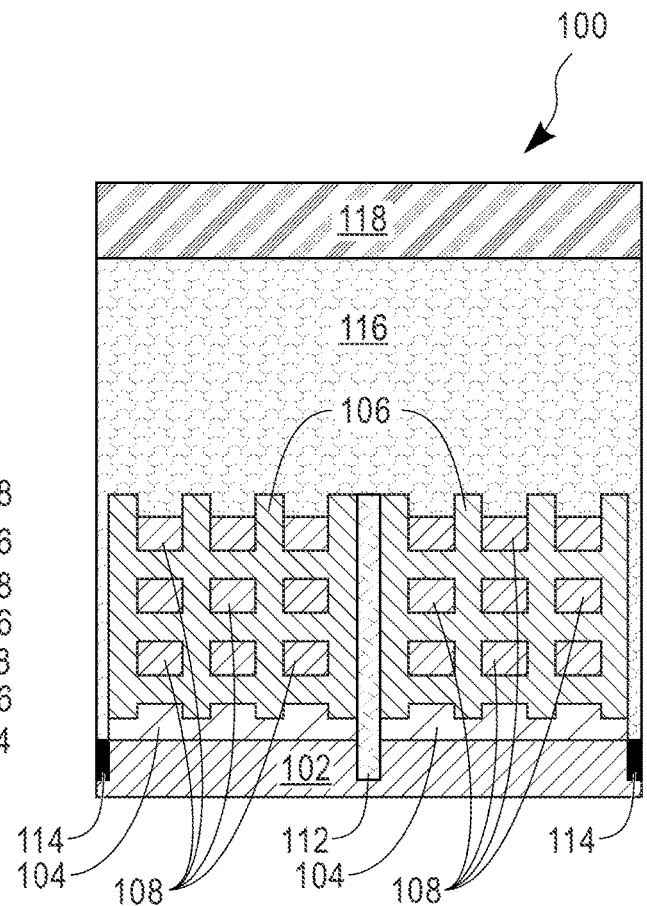
FIG. 8A          FIG. 8B
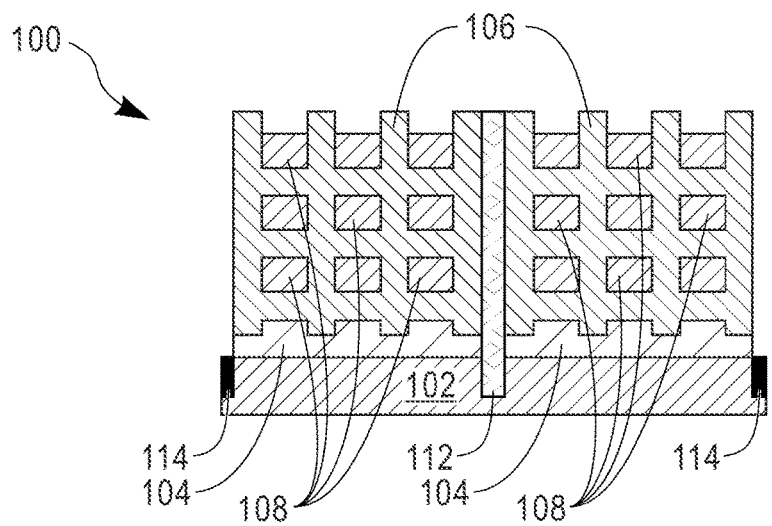
FIG. 8C

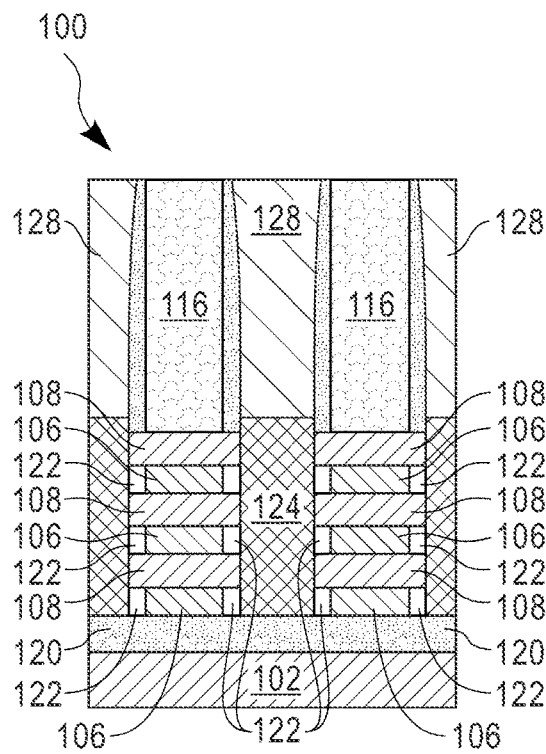
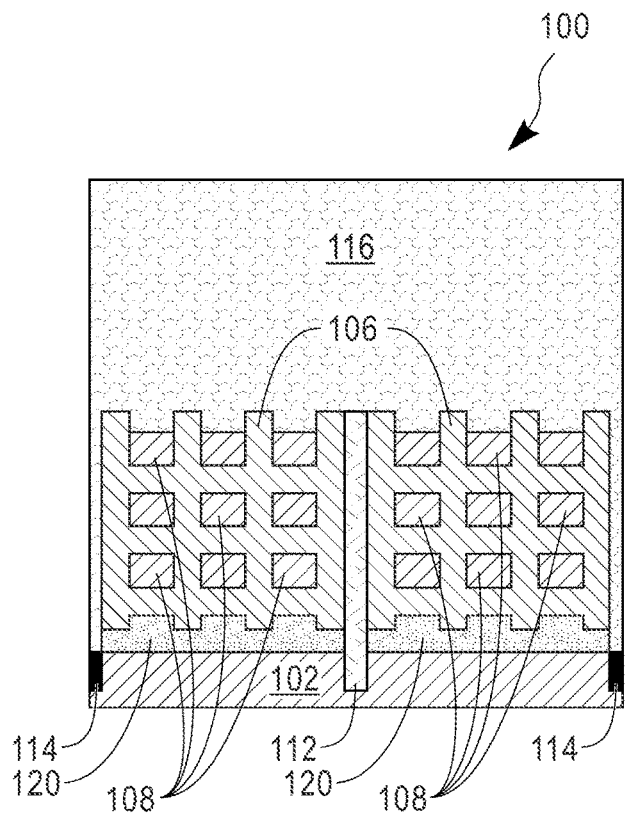
FIG. 12A    FIG. 12B
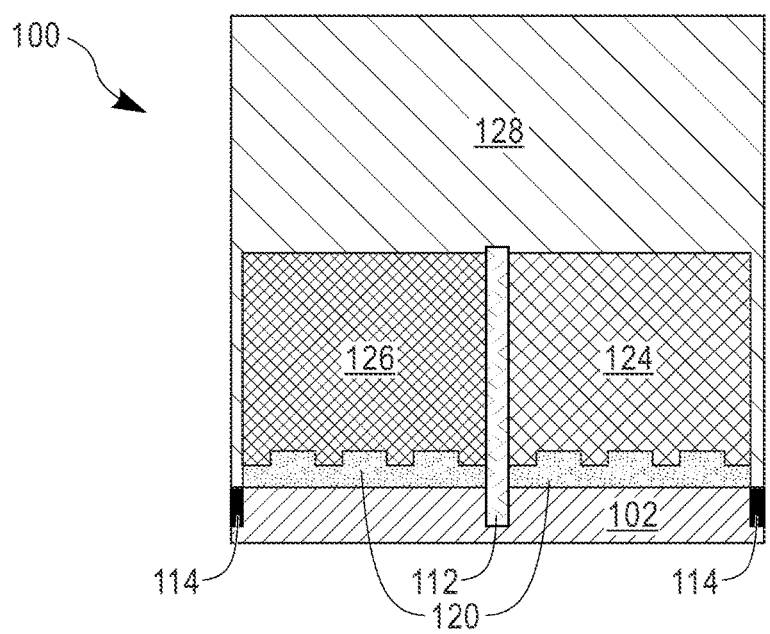
FIG. 12C

FIELD EFFECT TRANSISTORS COMPRISING A MATRIX OF GATE-ALL-AROUND CHANNELS

BACKGROUND

The present invention relates in general to semiconductor fabrication methods and resulting structures. More specifically, the present invention relates to gate-all-around field effect transistors (GAAFETs) co-integrating a matrix of nanowires or nanosheet channels with bottom dielectric isolation and self-aligned gate cut.

In an integrated circuit, transistors such as metal oxide semiconductor field effect transistors (MOSFETs) have a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer. Complementary metal oxide semiconductor (CMOS) is a technology that uses complementary and symmetrical pairs of p-type and n-type MOSFETs to implement logic functions. The channel region connects the source and the drain, and electrical current flows through the channel region from the source to the drain. The electrical current flow is induced in the channel region by a voltage applied at the gate electrode.

SUMMARY

Embodiments of the present invention include fabrication methods and the corresponding structures. Some embodiments include a semiconductor structure with shared gated devices. The semiconductor structure comprises a substrate and a bottom dielectric isolation (BDI) layer on top of the substrate. The semiconductor structure further comprises a pFET region that includes a p-doped Source-Drain epitaxy material and a first nanowire matrix above the BDI layer. The first nanowire matrix includes a plurality of Si nanowires surrounded by a first gate work function metal stack. The semiconductor structure further comprises an nFET region that includes a n-doped Source-Drain epitaxy material and a second nanowire matrix above the BDI layer. The second nanowire matrix includes a plurality of Si nanowires surrounded by a second gate work function metal stack. The semiconductor structure further comprises a conductive gate material on top of a portion of the first nanowire matrix and the second nanowire matrix. The semiconductor structure further comprises a vertical dielectric pillar separating the pFET region and the nFET region. The vertical dielectric pillar extends downward through the BDI layer into the substrate. The vertical dielectric pillar further extends upward through the conductive gate material to a dielectric located above the gate region.

Additional embodiments of the present disclosure include a semiconductor structure with isolated gate devices. The semiconductor structure comprises a substrate and a bottom dielectric isolation (BDI) layer on top of the substrate. The semiconductor structure further comprises a pFET region that includes a p-doped Source-Drain epitaxy material and a first nanowire matrix above the BDI layer. The first nanowire matrix includes a plurality of Si nanowires surrounded by a first gate work function metal stack. The semiconductor structure further comprises an nFET region that includes a n-doped Source-Drain epitaxy material and a second nanowire matrix above the BDI layer. The second nanowire matrix includes a plurality of Si nanowires surrounded by a second gate work function metal stack. The semiconductor structure further comprises a conductive gate material on top of a portion of the first nanowire matrix and the second nanowire matrix. The semiconductor structure further comprises a vertical dielectric pillar separating the pFET region and the nFET region. The vertical dielectric pillar extends downward through the BDI layer into the substrate. The vertical dielectric pillar further extends upward to a bottom of the conductive gate material.

Additional embodiments of the present disclosure include a fabrication method. The fabrication method comprises forming an m-by-n nanosheet matrix, the nanosheet matrix having at least two nanowires in each of a pFET region and an nFET region. The method further comprises forming a dielectric pillar between the pFET region and the nFET region, wherein the dielectric pillar extends into a substrate. The method further comprises forming a bottom dielectric isolation (BDI) layer between the substrate and the nanosheet matrix. The method further comprises forming one or more gates on top of the nanosheet matrix and the dielectric pillar. The one or more gates define a gate region. The dielectric pillar is in both the gate region and a source/drain region of the semiconductor device. The method further comprises forming a first top contact on top of a pFET source/drain epitaxy and a second top contact on top of a nFET source/drain epitaxy. The pFET source/drain epitaxy and the nFET source/drain epitaxy are formed in the source/drain region.

The above summary is not intended to describe each illustrated embodiment or every implementation of the present disclosure.

BRIEF DESCRIPTION OF THE DRAWINGS

The drawings included in the present disclosure are incorporated into, and form part of, the specification. They illustrate embodiments of the present disclosure and, along with the description, serve to explain the principles of the disclosure. The drawings are only illustrative of typical embodiments and do not limit the disclosure.

FIGS. 8A-C are cross-sectional views depicting the semiconductor structure of FIGS. 7A-C after one or more additional fabrication operations, in accordance with embodiments of the present disclosure.

FIGS. 12A-C are cross-sectional views depicting the semiconductor structure of FIGS. 11A-C after one or more additional fabrication operations, in accordance with embodiments of the present disclosure.

Figure 1:
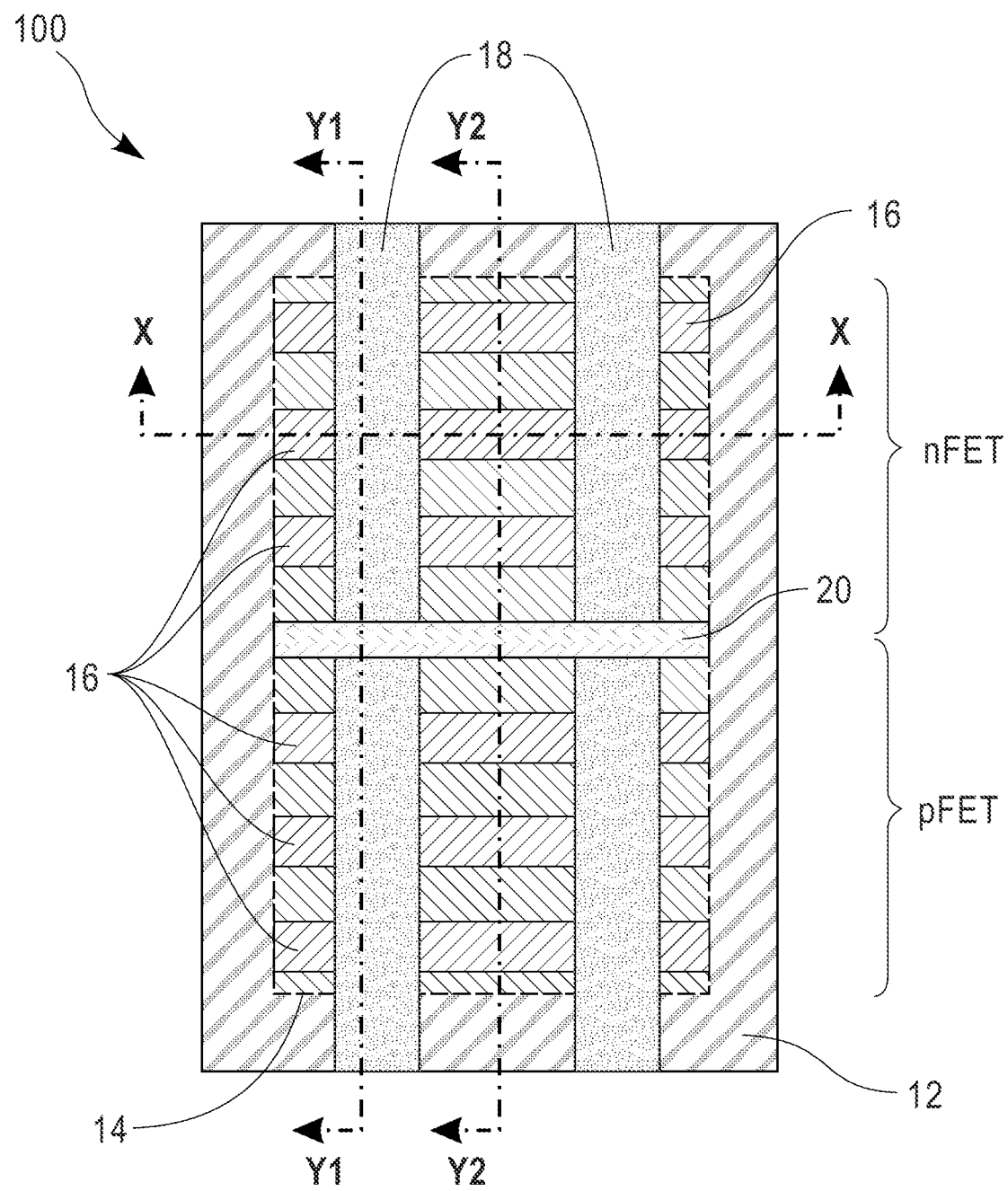
FIG. 1 is a plan view depicting a semiconductor structure, in accordance with embodiments of the present disclosure.

While the embodiments described herein are amenable to various modifications and alternative forms, specifics thereof have been shown by way of example in the drawings and will be described in detail. It should be understood, however, that the particular embodiments described are not to be taken in a limiting sense. On the contrary, the intention is to cover all modifications, equivalents, and alternatives falling within the spirit and scope of the invention.

DETAILED DESCRIPTION

Embodiments of the present invention are generally directed to gate-all-around field effect transistors (GAAFETs) co-integrating a matrix of nanowires or nanosheet channels with bottom dielectric isolation and self-aligned gate cut and methods of fabricating the same. While the present disclosure is not necessarily limited to such applications, various aspects of the disclosure may be appreciated through a discussion of various examples using this context.

Various embodiments of the present disclosure are described herein with reference to the related drawings, where like numbers refer to the same component. Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

It should also be understood that material compounds will be described in terms of listed elements, e.g., SiN, or SiGe. These compounds include different proportions of the elements within the compound, e.g., SiGe includes $Si_xGe_{(1-x)}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown because a person of ordinary skill in the art would recognize where masking and patterning processes are utilized to form the identified layers and openings, and to perform the identified selective etching processes, as described herein.

In general, the various processes used to form a microchip that will be packaged into an IC fall into four general categories, namely, film deposition, removal/etching, semiconductor doping and patterning/lithography.

Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Another deposition technology is plasma enhanced chemical vapor deposition (PECVD), which is a process which uses the energy within the plasma to induce reactions at the wafer surface that would otherwise require higher temperatures associated with conventional CVD. Energetic ion bombardment during PECVD deposition can also improve the film's electrical and mechanical properties.

Removal/etching is any process that removes material from the wafer. Examples include etch processes (either wet or dry), chemical-mechanical planarization (CMP), and the like. One example of a removal process is ion beam etching (IBE). In general, IBE (or milling) refers to a dry plasma etch method which utilizes a remote broad beam ion/plasma source to remove substrate material by physical inert gas and/or chemical reactive gas means. Like other dry plasma etch techniques, IBE has benefits such as etch rate, anisotropy, selectivity, uniformity, aspect ratio, and minimization of substrate damage. Another example of a dry removal process is reactive ion etching (RIE). In general, RIE uses chemically reactive plasma to remove material deposited on wafers. With RIE the plasma is generated under low pressure (vacuum) by an electromagnetic field. High-energy ions from the RIE plasma attack the wafer surface and react with it to remove material.

Semiconductor doping is the modification of electrical properties by doping, for example, transistor sources and drains, generally by diffusion and/or by ion implantation. These doping processes are followed by furnace annealing or by rapid thermal annealing ("RTA"). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and gradually the conductors, insulators and selectively doped regions are built up to form the final device.

Turning now to an overview of technologies that are more specifically relevant to aspects of the present disclosure, in general, a gate-all-around (GAA) FET, abbreviated GAAFET, and also known as a surrounding-gate transistor (SGT), is similar in concept to a FinFET except that the gate material surrounds the channel region on all sides. GAAFETs may, in some circumstances, include a nanowire/nanosheet structure. Some GAAFETs are vertically aligned, with a bottom source/drain disposed below the nanowire and/or nanosheets (e.g., between the nanowires and the substrate) and a top source/drain disposed on the top of the nanowires (opposite the bottom source/drain). Other GAAFETs may be horizontally aligned (e.g., a horizontal-transport GAAFET), where the current travels from the source to the drain in a horizontal direction.

GAAFETs can be used in high performance applications in complementary metal-oxide-semiconductor (CMOS) technology. Metal gates for the GAAFETs may be disposed on the sides of the nanowires, with a thin insulating dielectric material sitting between the gate and the nanowires. The thin insulating dielectric layer is typically made from silicon oxide, silicon nitride, or high K dielectric materials, such as $Al_2O_3$, $HfO_2$, $ZrO_2$ or a combination of these, deposited by chemical vapor deposition (CVD), for example.

There are several power performance area (PPA) requirements for nanosheet technology that currently limit usefulness of nanosheets. For example, bottom dielectric isolation (BDI) of the source and drain epitaxy from the substrate is required for optimal electrical performances at 12 nm effective gate lengths (Lmetal). Additionally, N-P boundary scaling for current and future nodes is needed. Work function metal (WFM) patterning is encountering limitation in sub-50 nm N-P space due to patterning edge placement error (EPE) and work function metal recess between N and P devices. Further scaling will require a self-align gate cut process (SAGC) with a self-aligned dielectric layer formed at the N-P boundary. Furthermore, optimal channel electrostatic for 12 nm Lmetal is accessible for sheet width (Wsheet)<25 nm (nanoellipses). Above 25 nm nanosheet width, the channels transition from a true GAA electrostatic regime into a dual-gate regime where the electrostatic control can be degraded. However limiting the width of the sheets to 25 nm also limits the drive current capability of the device, requiring more nanosheets to compensate. Hence, there is a need for a GAAFET device structure delivering: (1) optimal electrostatic control over the channel (sheet width≤25 nm); (2) large effective width for maximum effective width per foot print; (3) Bottom Dielectric Isolation to enable aggressively scaled effective gate length (Lmetal=12 nm) and (iv) self-aligned gate cut to enable aggressive N-P boundary scaling.

Embodiments of the present disclosure may address the PPA requirement above for current and future GAA nodes. This is accomplished through a new type of GAAFET using a matrix of nanowires or nanosheet as the channel region. In some embodiments, individual devices of P and N polarities are formed by a nanosheet matrix of at least 2×1 channels for each polarity sitting above a shared dielectric isolation region. Horizontal and vertical spaces between consecutive nanowires are similar (e.g., within 1-2 nm variation). A vertical dielectric pillar is formed in-between the P and N devices in both the gate regions and source-drain regions. The vertical dielectric pillar is formed at approximately equidistance from the P and N channels and is in contact with the pWFM, the nWFM, and the bottom dielectric isolation of both P and N devices. In some embodiments, the final structure can have an uneven bottom dielectric isolation layer from fin formation.

Some embodiments of the present disclosure include a method of forming the GAAFET with a matrix of nanowires or nanosheet as the channel region. The method may comprise forming nanosheet (NS) stack epitaxy with additional sacrificial high-Ge % SiGe layer. The method may further comprise patterning fins with fin-fin space approximately identical to NS-NS vertical space along with larger spaced regions between N and P devices. The method may further comprise etching fins and stop etching in sacrificial high-Ge % SiGe layer. The method may further comprise forming a sacrificial low-Ge % SiGe layer epitaxy between the fins.

After forming the sacrificial low-Ge % SiGe layer, the method may comprise etching vertically into the substrate in regions where the low-Ge % SiGe layer is unmerged. The method may further comprise forming a dielectric pillar in the N-P space. The method may further comprise forming STI on the substrate at the edges of the N and P regions. The method may further comprise forming dummy gates and hard masks above the Si nanowires made from the nanosheets.

After forming the dummy gates, the method may comprise removing selectively high-Ge % SiGe layer between the dummy gates and forming simultaneously a gate spacer and bottom dielectric isolation layer. Inner spaces may also be formed. Fins may be recessed and self-aligned to the gates. The method may further comprise forming p-type doped field effect transistor (pFET) and n-type doped field effect transistor (nFET) epitaxy contacts sequentially. Interlayer dielectric may be deposited and planarized. The dummy gates and low-Ge % SiGe layers may then be removed. pFET and nFET WFM (also referred to herein as pWFM and nWFM) may be formed in the nanosheet matrix, a tungsten layer may be deposited around the pFET and nFET WFM, and a self-aligned contact cap may be formed on top of the tungsten layer. Finally, a metallic trench contact may be formed.

Advantageously, some embodiments of the present disclosure may address the PPA requirement above for current and future GAA nodes. The BDI may neutralize leakage and enable Lmetal=12 nm devices. The SAGC may allow for ultimate scaling for N-P space, including at sizes <15 nm. The matrix of n*m nanosheet channels (which may have a width of, e.g., <25 nm) preserve optimal electrostatics while maintaining drive current capability and performance. Additionally, all the processes in the fabrication flow are known processes, with most of them have already been on previous or current technology nodes, which means that the devices can be created using existing system with minimal modification.

Turning now to the figures, FIG. 1 is a plan view depicting a semiconductor structure, in accordance with embodiments of the present disclosure. In particular, FIG. 1 shows a plan view of a GAA nanosheet matrix-FET 100. The GAA nanosheet matrix-FET 100 contain an nFET region and a pFET region separated by a N-P dielectric 20. Gates 18 run the length of the GAA nanosheet matrix-FET 100, crossing on top of a nanosheet matrix that comprises WFM regions 14 and nanowire regions 16. A shallow trench isolation (STI) layer 12 surrounds the nanosheet matrix.

FIGS. 2A-16C depict a fabrication process for forming a GAA nanosheet matrix-FET (e.g., the GAA nanosheet matrix-FET 100 shown in FIG. 1), in accordance with embodiments of the present disclosure. In particular, the figures that have a figure number ending in 'A' (e.g., FIG. 2A, FIG. 3A, FIG. 4A, etc.) show the GAA nanosheet matrix-FET when viewed along the X-X cut shown in FIG. 1. Likewise, the figures that have a figure number ending in 'B' (e.g., FIG. 2B, FIG. 3B, FIG. 4B, etc.) show the GAA nanosheet matrix-FET 100 when viewed along the Y1-Y1 cut shown in FIG. 1, and the figures that have a figure number ending in 'C' (e.g., FIG. 2C, FIG. 3C, FIG. 4C, etc.) show the GAA nanosheet matrix-FET 100 when viewed along the Y2-Y2 cut shown in FIG. 1.

Figure 2A:
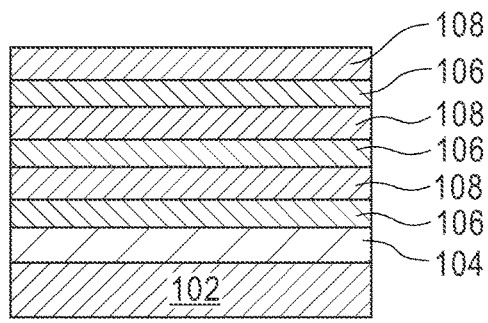
FIGS. 2A-C are cross-sectional views depicting a semiconductor structure at an intermediate stage of the manufacturing process, in accordance with embodiments of the present disclosure.
Figure 2B:
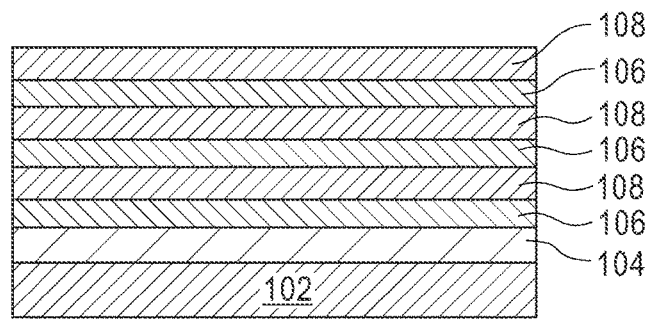
Figure 2C:
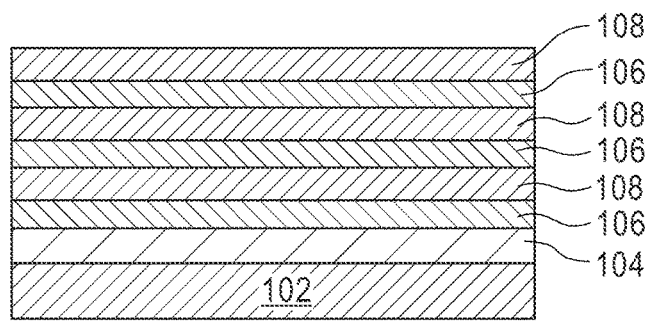

Referring to FIGS. 2A-2C, shown are cross-sectional views depicting the GAA nanosheet matrix-FET 100 of FIG. 1 at an intermediate stage of the manufacturing process, in accordance with embodiments of the present disclosure. In particular, FIGS. 2A-2C show a nanosheet stack epitaxy from which the GAA nanosheet matrix-FET 100 is fabricated. The nanosheet stack epitaxy includes a high-Ge % SiGe layer 104 on top of a substrate 102. The substrate 102 may be, for example, a Si substrate. The high-Ge % SiGe layer 104 may be, for example, SiGe60%. The high-Ge % SiGe layer 104 may act as a sacrificial layer that is replaced in subsequent fabrication operations. Alternating a lower-Ge % SiGe layers 106 and Si layers 108 are formed on top of the high-Ge % SiGe layer 104. The lower-Ge % SiGe layers 106 may comprises, for example, SiGe25%.

Although three Si layers 108 are depicted in the stack, corresponding to three nanosheet in the GAA nanosheet matrix-FET 100, this is done for illustrative purposes only. As would be recognized by a person of ordinary skill, fewer than or greater than the three nanosheets can be present as can be desired for different nFET and pFET nanosheet structures.

Figures 3A, 3B:
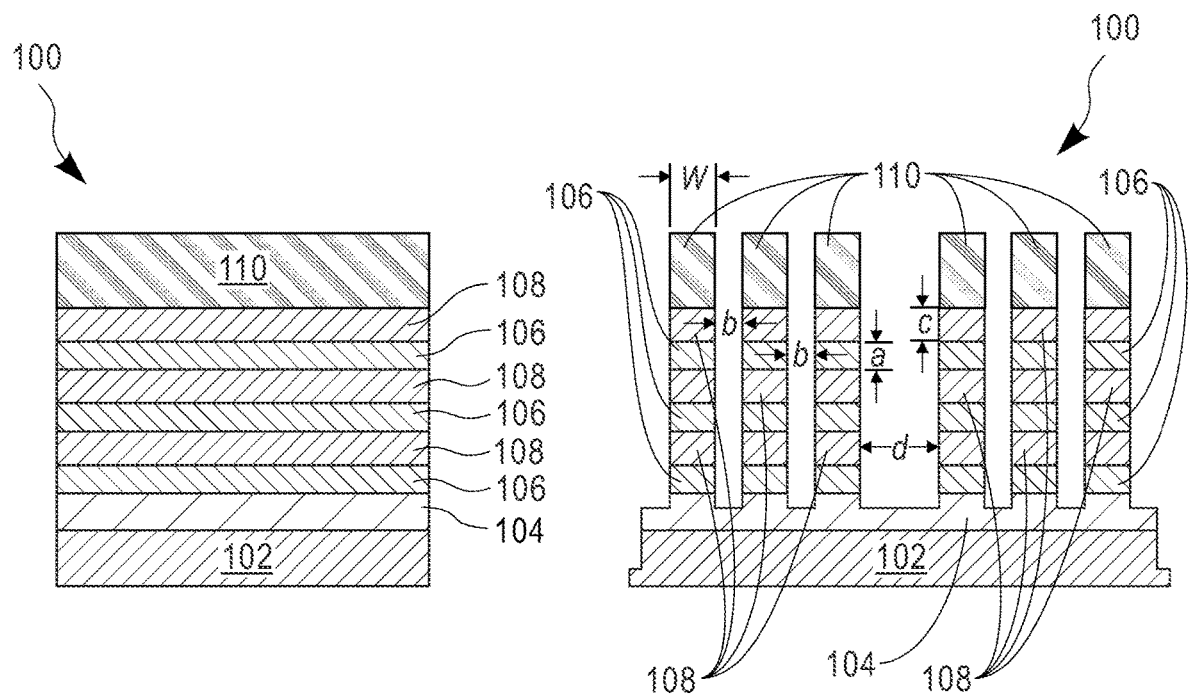
FIGS. 3A-C are cross-sectional views depicting the semiconductor structure of FIGS. 2A-C after one or more additional fabrication operations, in accordance with embodiments of the present disclosure.
Figure 3C:
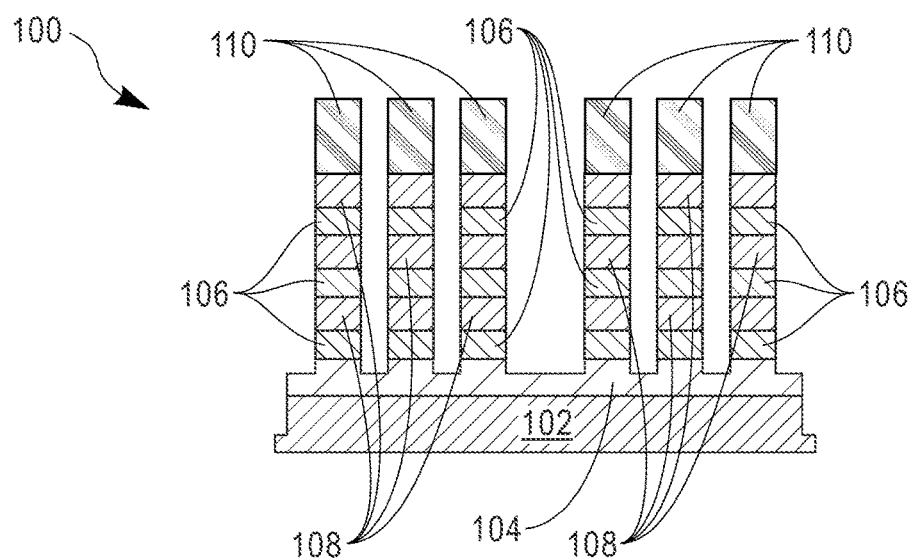

FIGS. 3A-3C depict the GAA nanosheet matrix-FET 100 after stack patterning and partial fin RIE operations. A hard mask 110 is deposited over portions of the top layer of Si. An extreme ultraviolet lithography (EUV) stack patterning and/or ME operation is then used to create a plurality of fins in the GAA nanosheet matrix-FET 100. As shown in FIG. 3B, the fins may have a width of W and the channels between fins may go through all of the Si layers 108 and lower-Ge % SiGe layers 106. The high-Ge % SiGe layer 104 may act as an etch stop such that it is only partially etched into.

The fin-fin spacing, represented by 'b' in FIG. 3B, may be substantially similar to the spacing between Si nanosheets (NS) 108. In other words, the gap between the individual fins in the same region (e.g., in the nFET region or the pFET region) may be approximately the same size as the thickness of the lower-Ge % SiGe layers 106, which is represented by distance 'a' in FIG. 3B. A larger gap, represented by 'd' in FIG. 3B, may be etched between the pFET and nFET regions.

In some embodiments, the width of the fins is approximately 10 nm to 25 nm, the thickness of the lower-Ge % SiGe layers 106 is approximately 11 nm, the gap between fins in the same region is also approximately 11 nm, and the distance between the pFET and nFET regions may be approximately 15 nm+twice the gap between the fins, which in this example is approximately 37 nm. While shown as roughly the same size as the lower-Ge % SiGe layers 106, the Si layers 108 may actually be roughly half the size of the lower-Ge % SiGe layers 106. For example, in some embodiments, the thickness of the Si layers 108 is approximately 6 nm.

It is to be understood that these values are all approximate values of some embodiments of the present disclosure. Except where inconsistent or infeasible, other embodiments may have different dimensions (including different relative dimensions between components) without departing from the spirit of scope of the invention, as would be understood by a person of ordinary skill in the art.

Figure 4A:
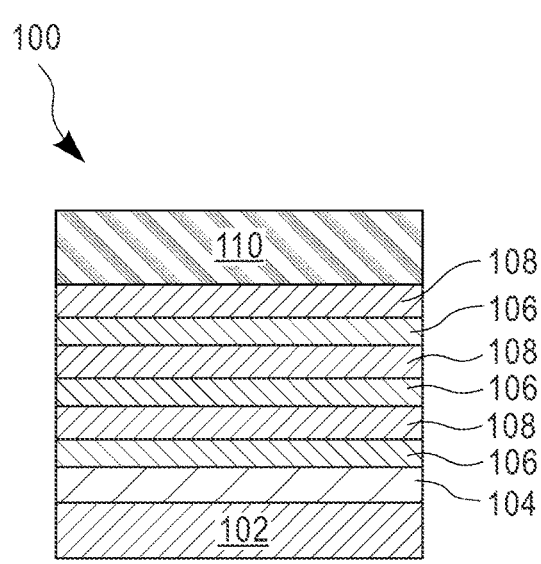
FIGS. 4A-C are cross-sectional views depicting the semiconductor structure of FIGS. 3A-C after one or more additional fabrication operations, in accordance with embodiments of the present disclosure.
Figure 4B:
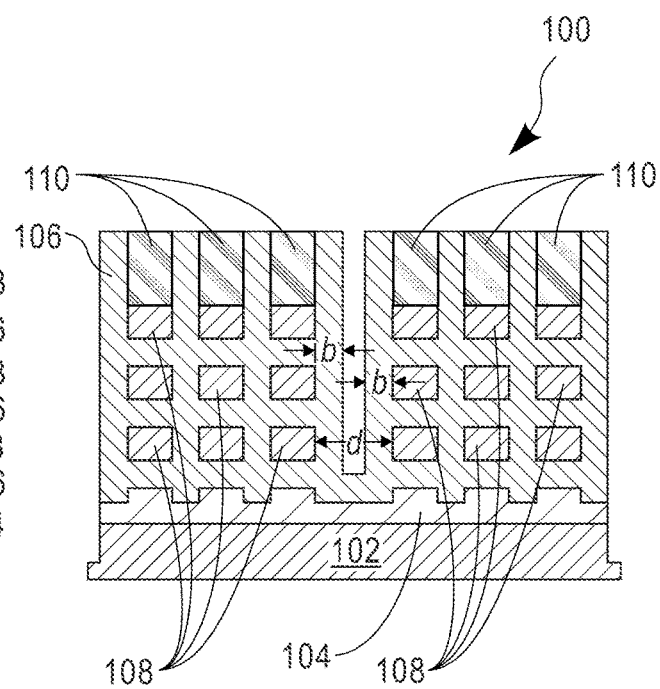
Figure 4C:
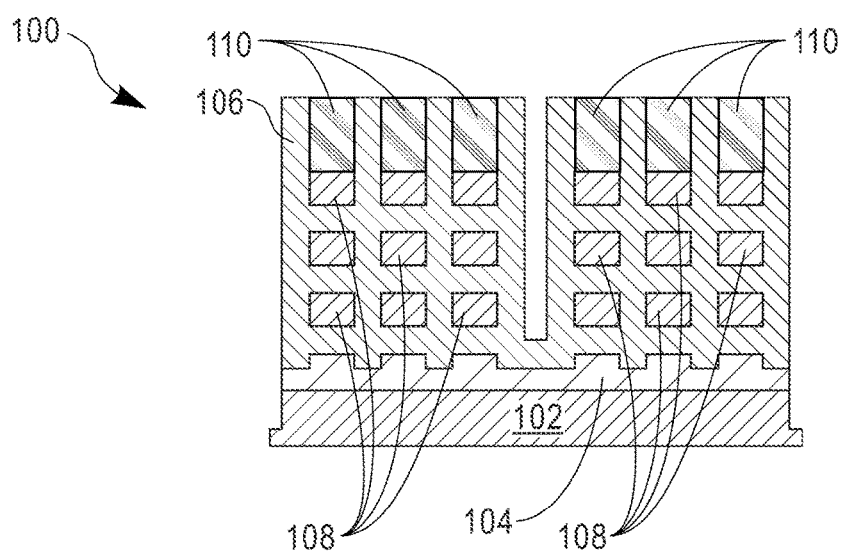

FIGS. 4A-4C depict the GAA nanosheet matrix-FET 100 after forming lower-Ge % SiGe material 106 between the fins. The lower-Ge % SiGe material 106 may be grown to substantially fill in gaps between fins. Alternatively, conformal CVD/PECVD deposition of amorphous SiGe may be used to fill in the gaps with the lower-Ge % SiGe material 106. A CMP operation may then be performed to remove excess lower-Ge % SiGe material 106 from the top of the structure 100. Because the epitaxial growth (or conformal CVD/PECVD deposition) of the lower-Ge % SiGe material 106 is done to a thickness necessary to fill in the gaps between the fins ('b' in the figures), and the gap between the pFET and nFET regions ('d' in the figures) is larger than twice the size of the gap between fins in the same region, the formation of the lower-Ge % SiGe material 106 leaves a gap between the nFET and pFET regions. This gap can be seen in FIGS. 4B and 4C.

Figure 5A:
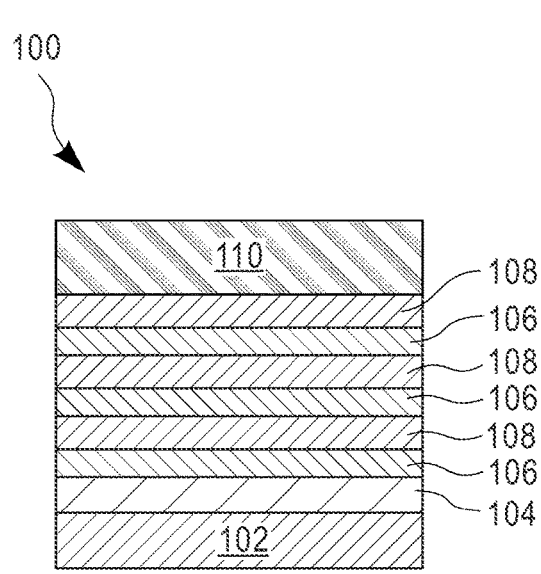
FIGS. 5A-C are cross-sectional views depicting the semiconductor structure of FIGS. 4A-C after one or more additional fabrication operations, in accordance with embodiments of the present disclosure.
Figure 5B:
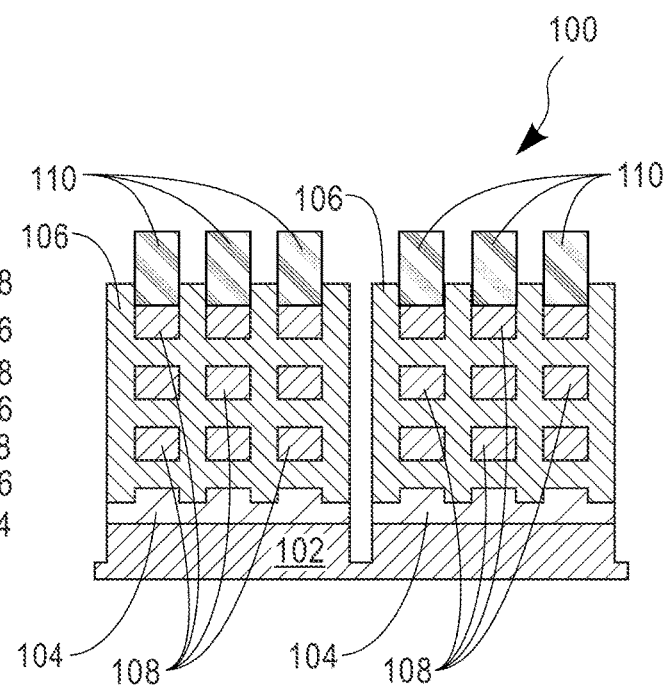
Figure 5C:
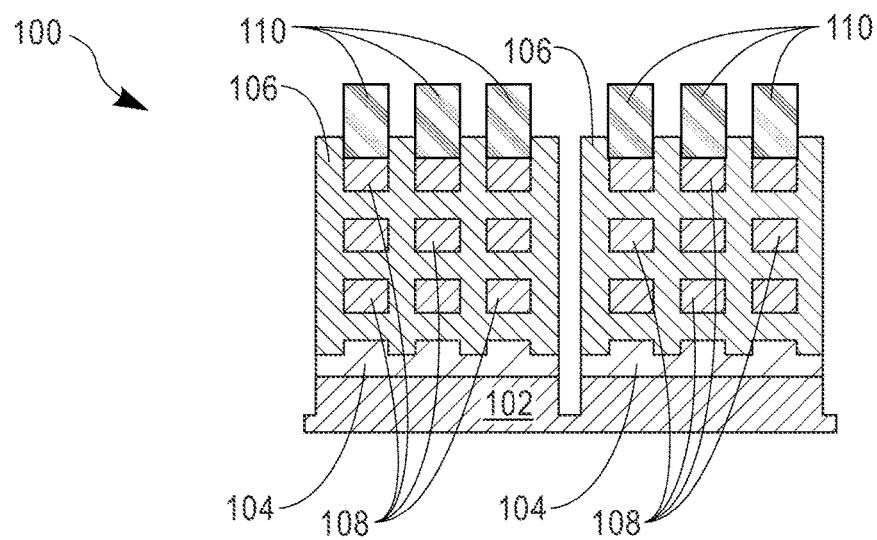

FIGS. 5A-5C depict the GAA nanosheet matrix-FET 100 after performing a vertical etch operation. The vertical etch operation may be an anisotropic SiGe/Si etch. The etch may remove a portion of the lower-Ge % SiGe material 106 from the top of the structure 100, exposing part of the sides of the hard mask 110. In addition, the etch process extends vertically into the substrate 102 in regions where the lower-Ge % SiGe material 106 is unmerged, as shown in FIGS. 5A-5C. This effectively separates the lower-Ge % SiGe material 106 and the high-Ge % SiGe material 104 in the pFET region from the same material in the nFET region.

Figure 6A:
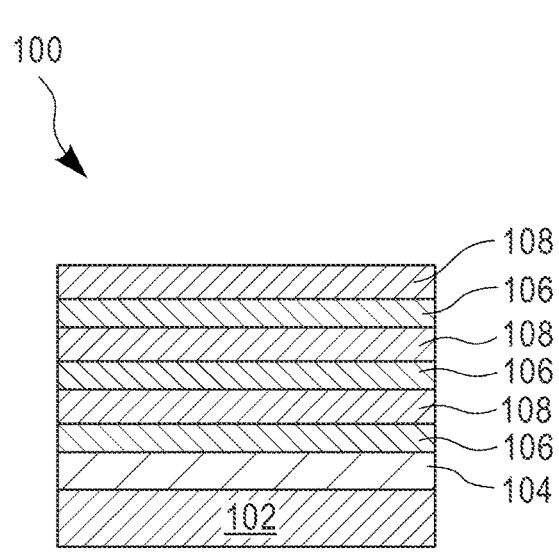
FIGS. 6A-C are cross-sectional views depicting the semiconductor structure of FIGS. 5A-C after one or more additional fabrication operations, in accordance with embodiments of the present disclosure.
Figure 6B:
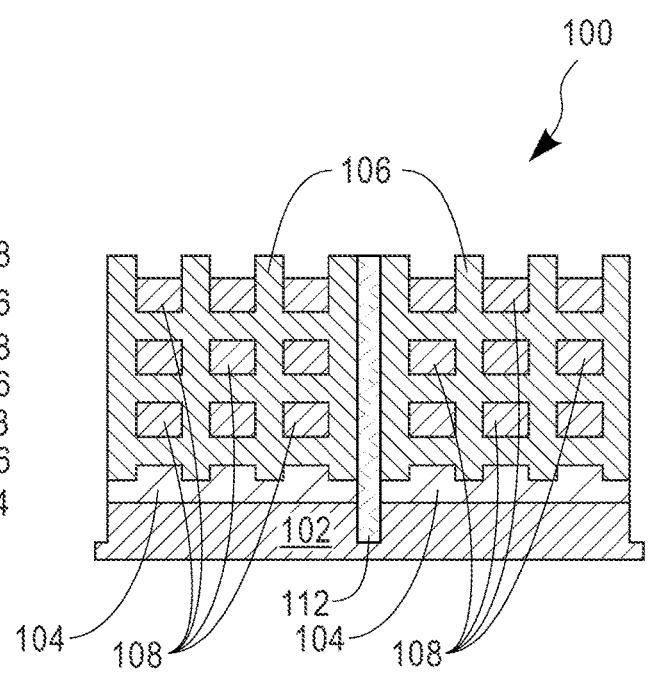
Figure 6C:
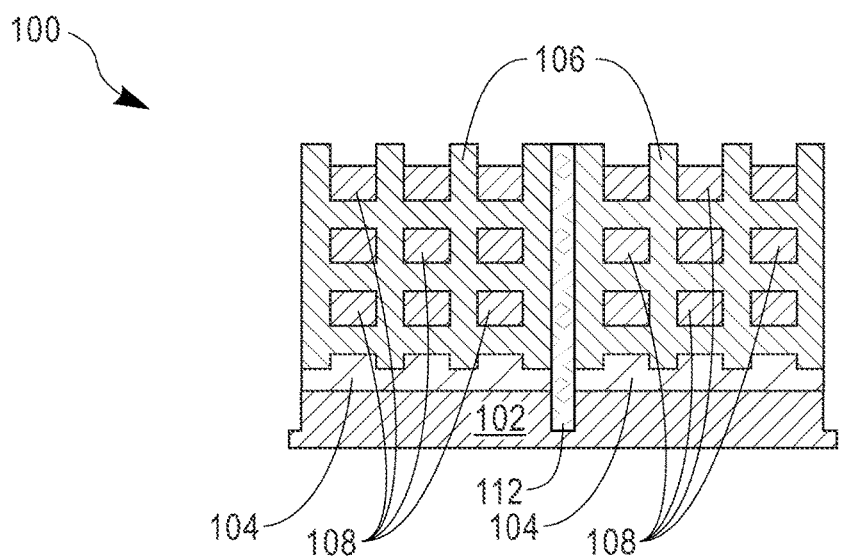

FIGS. 6A-6C depict the GAA nanosheet matrix-FET 100 after forming a dielectric pillar 112 in the etched space between the nFET region and the pFET region. The dielectric pillar may be formed by conformal low-k material deposition followed by an isotropic etch back, which removes excess low-k material and the hard mask 110. In some embodiments, the dielectric pillar 112 is SiOCN.

Figure 7A:
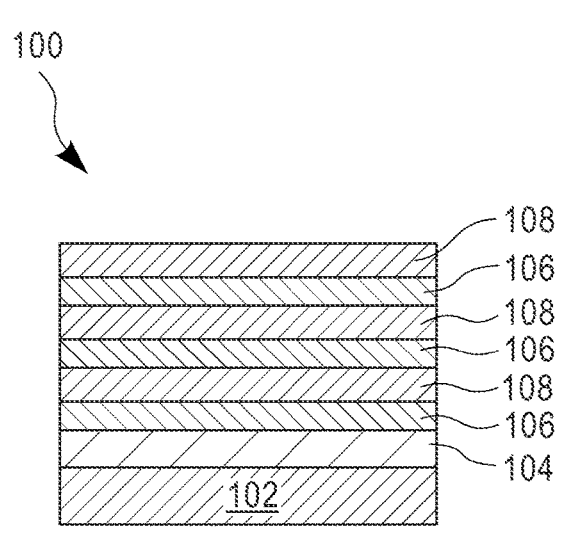
FIGS. 7A-C are cross-sectional views depicting the semiconductor structure of FIGS. 6A-C after one or more additional fabrication operations, in accordance with embodiments of the present disclosure.
Figure 7B:
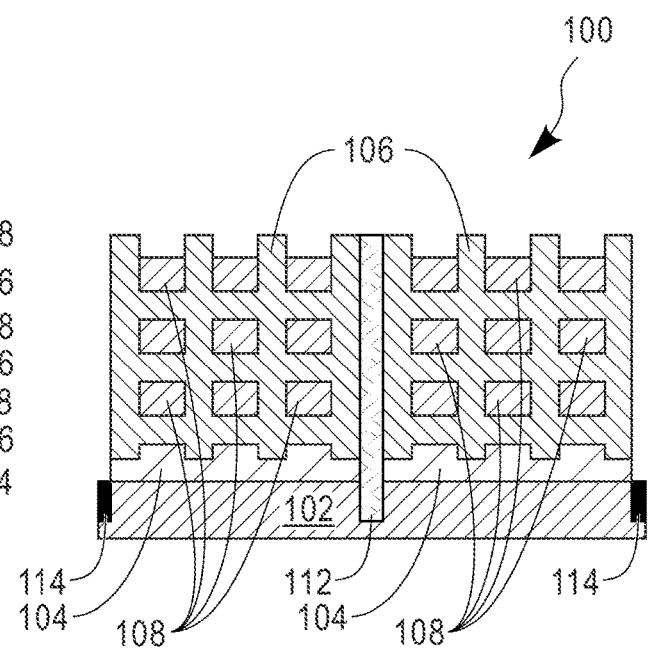
Figure 7C:
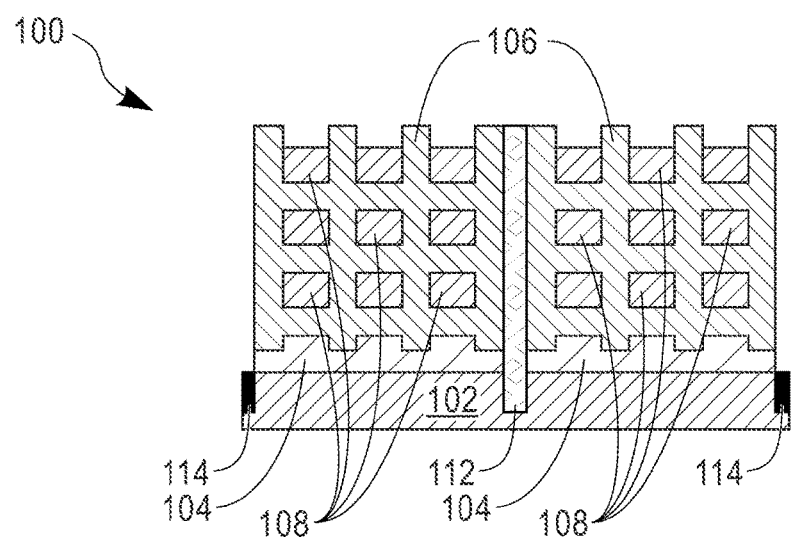

FIGS. 7A-7C depict the GAA nanosheet matrix-FET 100 after STI 114 formation. The STI 114 is formed in areas of the substrate 102 that were etched during the anisotropic etch operation. In particular, the STI 114 is formed along the sides of the nFET and pFET regions to prevent electric current leakage between the GAA nanosheet matrix-FET 100 and adjacent semiconductor devices. In some embodiments, the STI may be an oxide.

FIGS. 8A-8C depict the GAA nanosheet matrix-FET 100 after the formation of dummy gates 116. The dummy gates 116 may be formed on top of portions of the STI layers 114, the previously exposed Si layers 108, the lower-Ge % SiGe layers 106, and the dielectric pillar 112. The dummy gates 116 may be made of amorphous silicon (a-Si). A hard mask 118 may also be formed on top of the dummy gates 116.

Figure 9A:
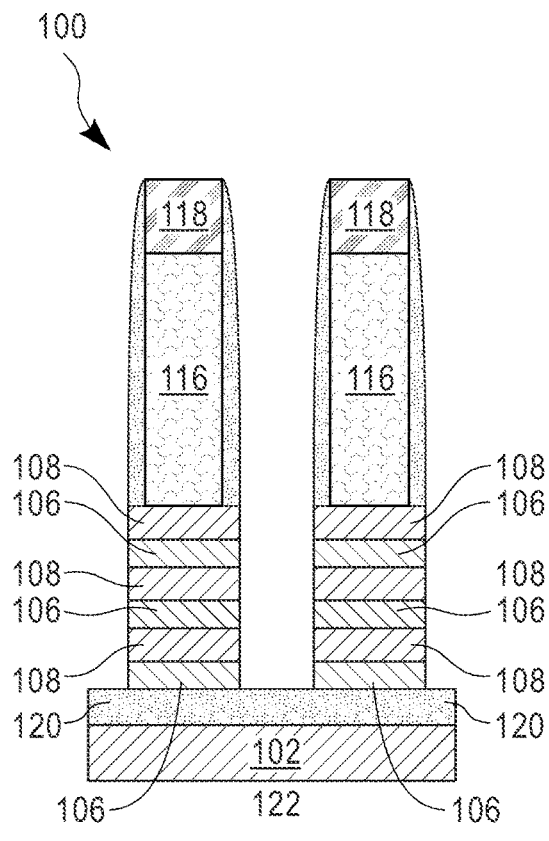
FIGS. 9A-C are cross-sectional views depicting the semiconductor structure of FIGS. 8A-C after one or more additional fabrication operations, in accordance with embodiments of the present disclosure.
Figure 9B:
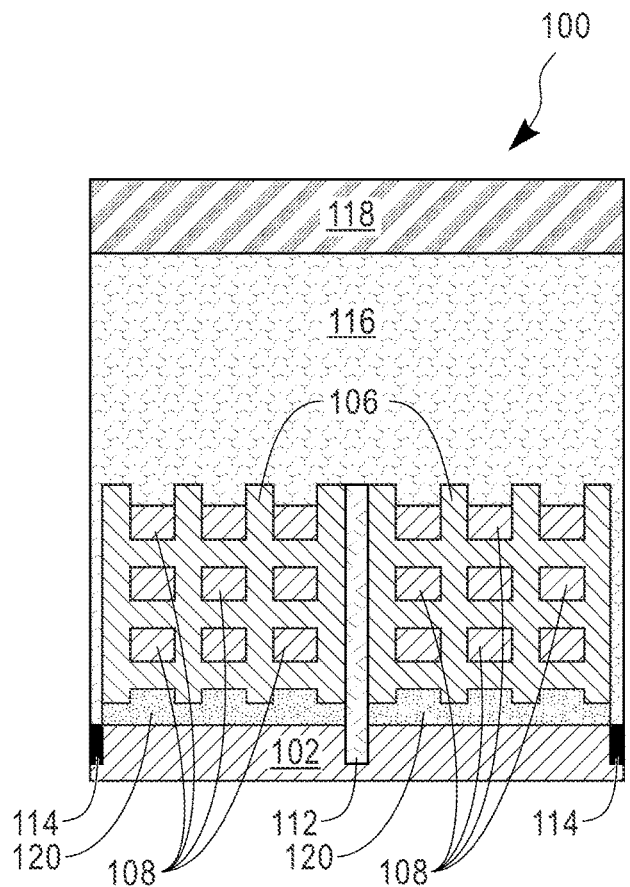
Figure 9C:
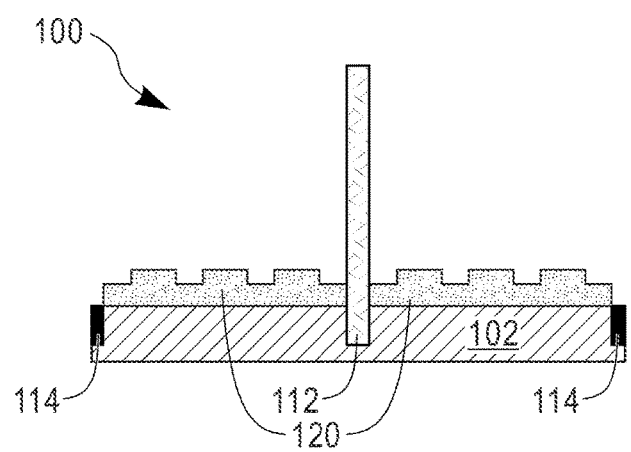

FIGS. 9A-9C depict the GAA nanosheet matrix-FET 100 after additional fabrication processes are performed. After forming the dummy gates 116 and hard mask 118, the high-Ge % SiGe layer 104 is removed and replaced with a BDI material 120. The BDI material 120 may be, for example, SiO2, SiOCN, SiOC, SiBCN. The BDI 120 may be deposited on the substrate 102 after removal of the high-Ge % SiGe layer 104. Furthermore, the BDI material 120 may be deposited on the sides of the dummy gates 116 and the hard mask 118, as shown in FIG. 9A.

In addition to depositing replacing the high-Ge % SiGe layer 104 with the BDI material 120, a fin recess process may be performed that selectively removes parts of the Si layers 108 and the low-Ge % SiGe layers 106. The recessed fins are self-aligned to the gates. This can be seen in FIG. 9A, where the fins are separated all the way down to the BDI layer 120, and FIG. 9C, where the Si layers 108 and the low-Ge % SiGe layers 106 have been completely removed.

Figure 10A:
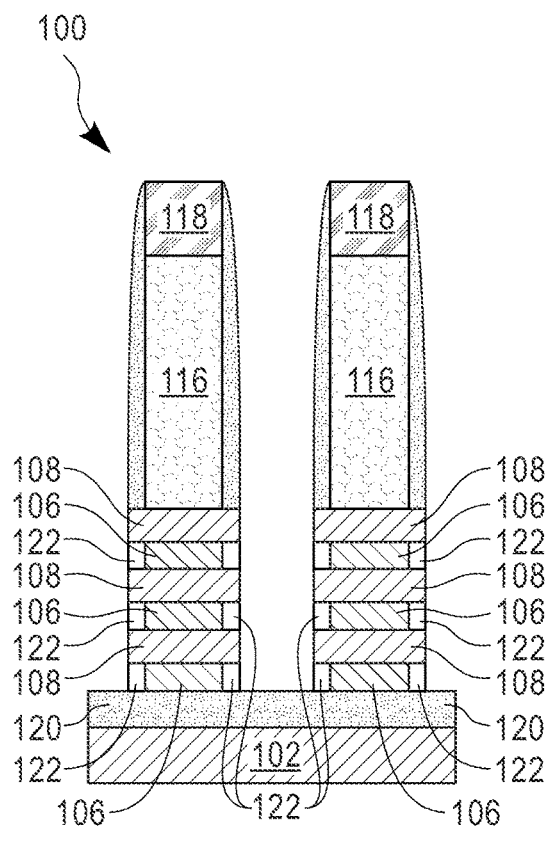
FIGS. 10A-C are cross-sectional views depicting the semiconductor structure of FIGS. 9A-C after one or more additional fabrication operations, in accordance with embodiments of the present disclosure.
Figure 10B:
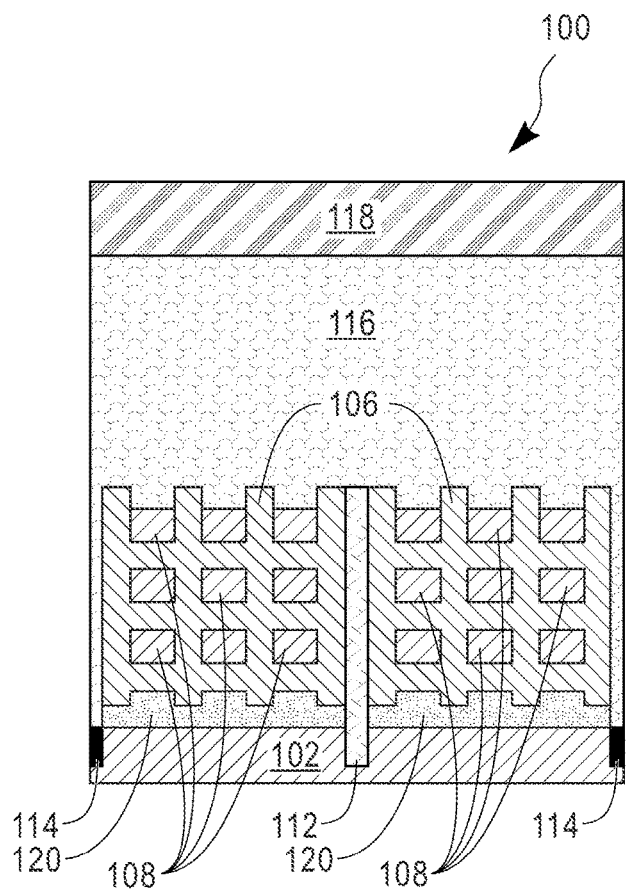
Figure 10C:
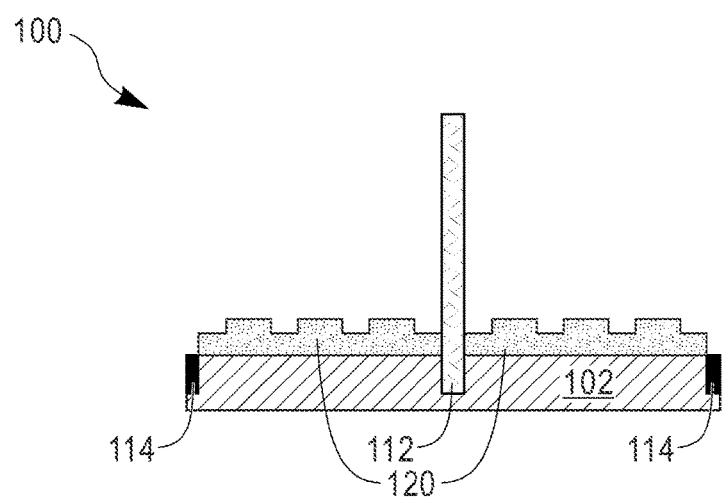

FIGS. 10A-10C depict the GAA nanosheet matrix-FET 100 after inner spacers 122 are formed. The inner spacers 122 may be formed on the remaining low-Ge % SiGe layers 106. As illustrated in FIG. 10A, the inner spacers 122 may be formed along the edges of the low-Ge % SiGe layers 106 (i.e., at the edges of the gates). This may be done by selectively indenting the low-Ge % SiGe layers 106, depositing the inner spacers 122 in the indents, and then etching back to re-expose the Si layers 108. The inner spacers 122 may be an isolating material, such as SiO2, SiN, SiBCN, SiOCN, SiOC.

Figure 11A:
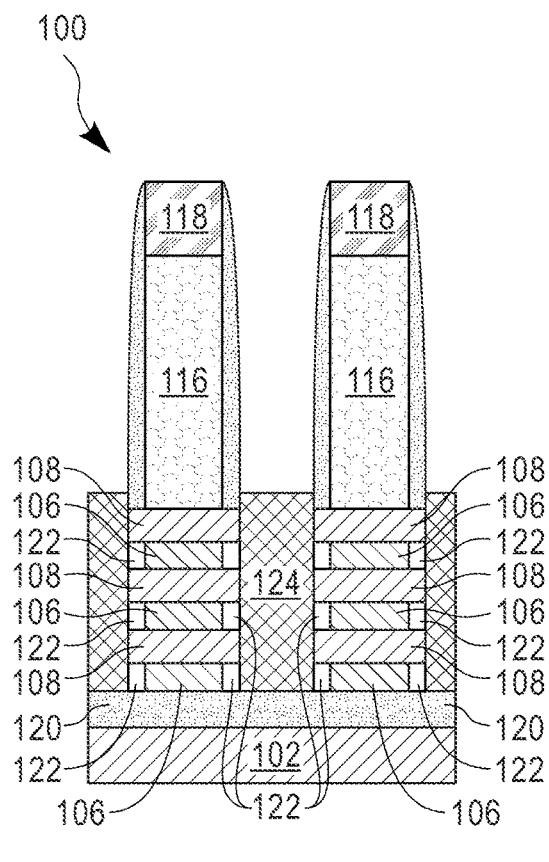
FIGS. 11A-C are cross-sectional views depicting the semiconductor structure of FIGS. 10A-C after one or more additional fabrication operations, in accordance with embodiments of the present disclosure.
Figure 11B:
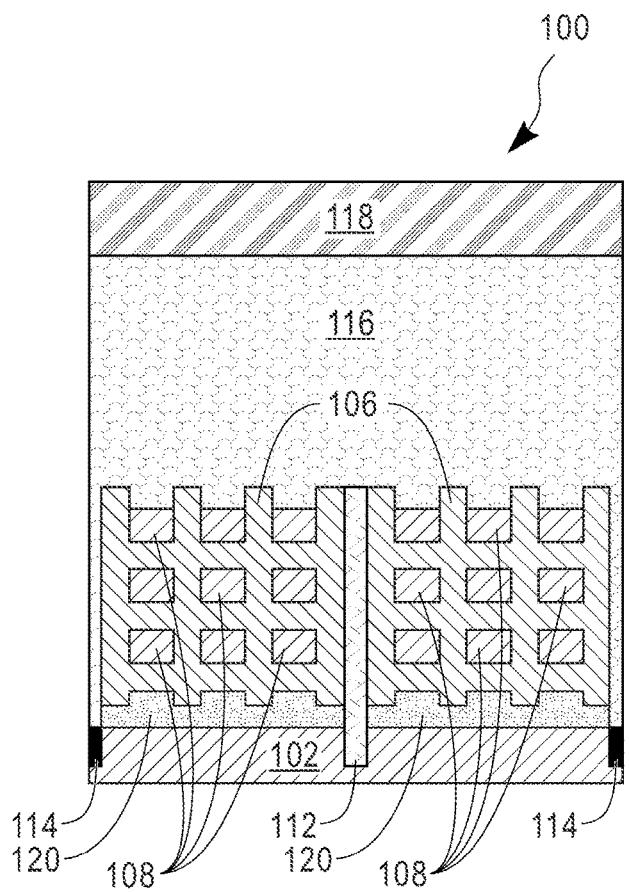
Figure 11C:
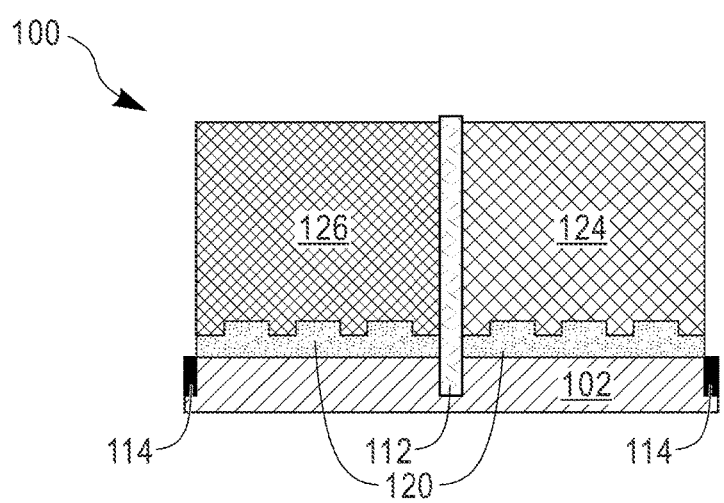

FIGS. 11A-11C depict the GAA nanosheet matrix-FET 100 after formation of the nFET source/drain epitaxy 124 and pFET source/drain epitaxy 126. The nFET and pFET source/drain epitaxy materials 124, 126 may be grown in a sequential operation (i.e., one after the other), and they may be formed such that they do not reach the top of the dielectric pillar 112, as shown in FIG. 11C.

FIGS. 12A-12C depict the GAA nanosheet matrix-FET 100 after formation of the interlayer dielectric (ILD) layer 128. The ILD layer 128 may be, in some embodiments, $SiO_2$. The ILD layer 128 lay may be deposited such that it fills the area between the gates (as shown in FIG. 12A) and sits on top of the nFET and pFET source/drain epitaxy materials 124, 126 (as shown in FIG. 12C). The ILD layer 128 may also sit on top of portions of the STI 114. A CMP operation may then be performed to remove the hard mask 118, thereby exposing the top of the dummy gates 116 and planarizing the top of the ILD material 128, the dummy gates 116, and the BDI material 120, as shown in FIG. 12A.

Figure 13A:
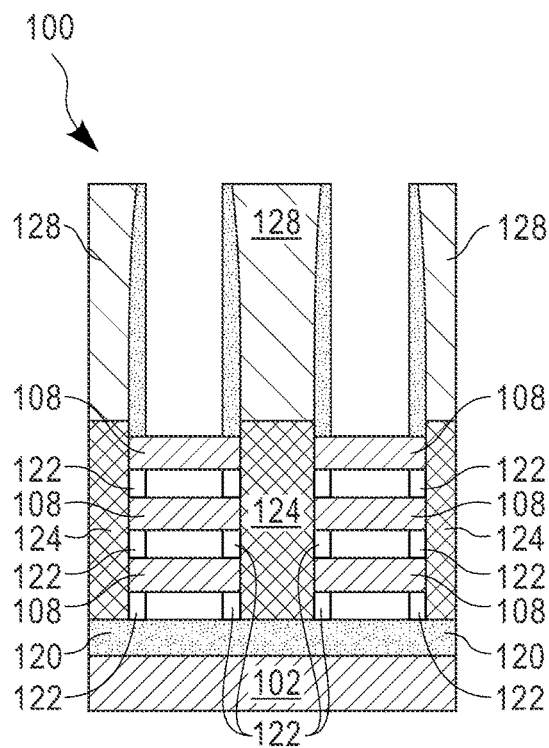
FIGS. 13A-C are cross-sectional views depicting the semiconductor structure of FIGS. 12A-C after one or more additional fabrication operations, in accordance with embodiments of the present disclosure.
Figure 13B:
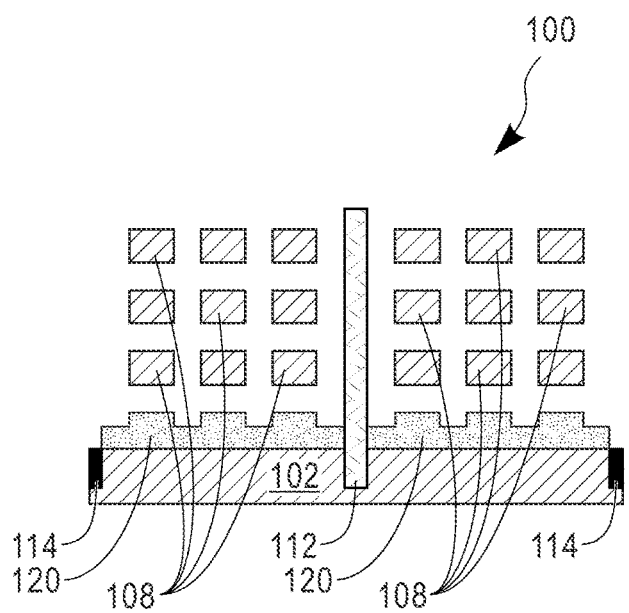
Figure 13C:
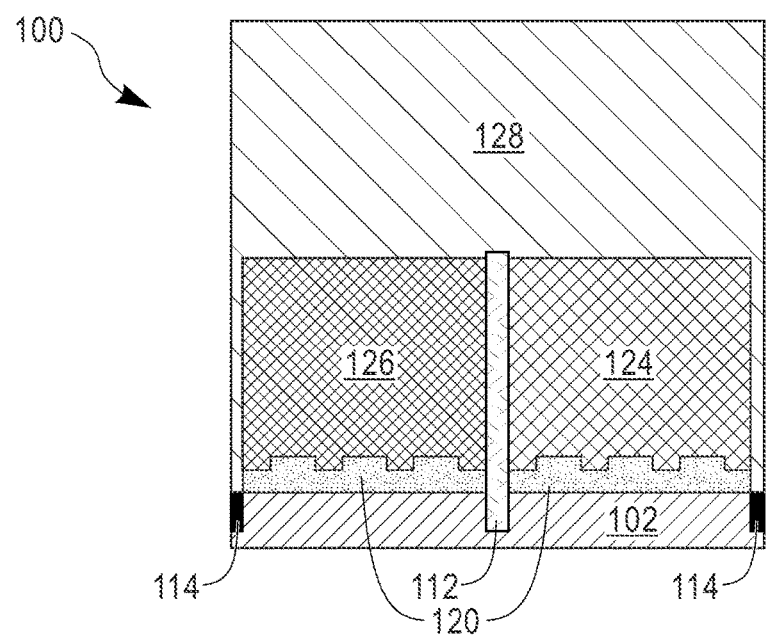

FIGS. 13A-13C depict the GAA nanosheet matrix-FET 100 after removal of the dummy gates 116 and the remaining low-Ge % SiGe layers 106. The dummy gates 116 and the remaining low-Ge % SiGe layers 106 may be removed by any suitable fabrication process, as would be known to a person of ordinary skill.

Figure 14A:
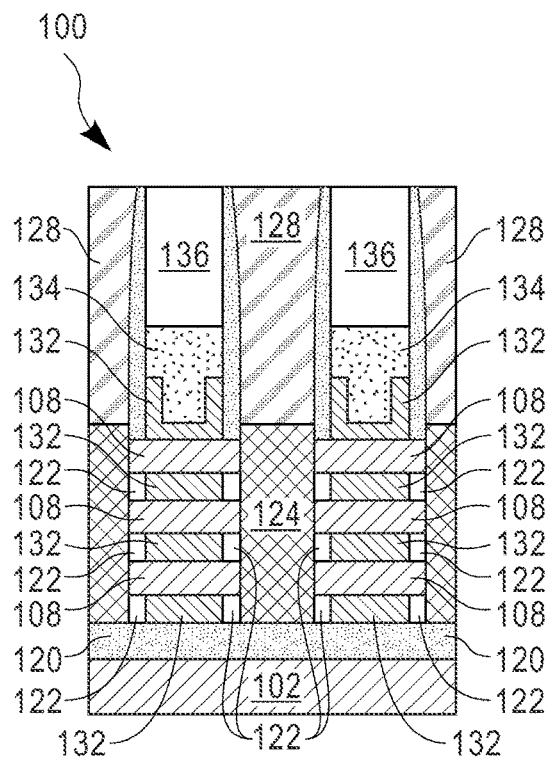
FIGS. 14A-C are cross-sectional views depicting the semiconductor structure of FIGS. 13A-C after one or more additional fabrication operations, in accordance with embodiments of the present disclosure.
Figure 14B:
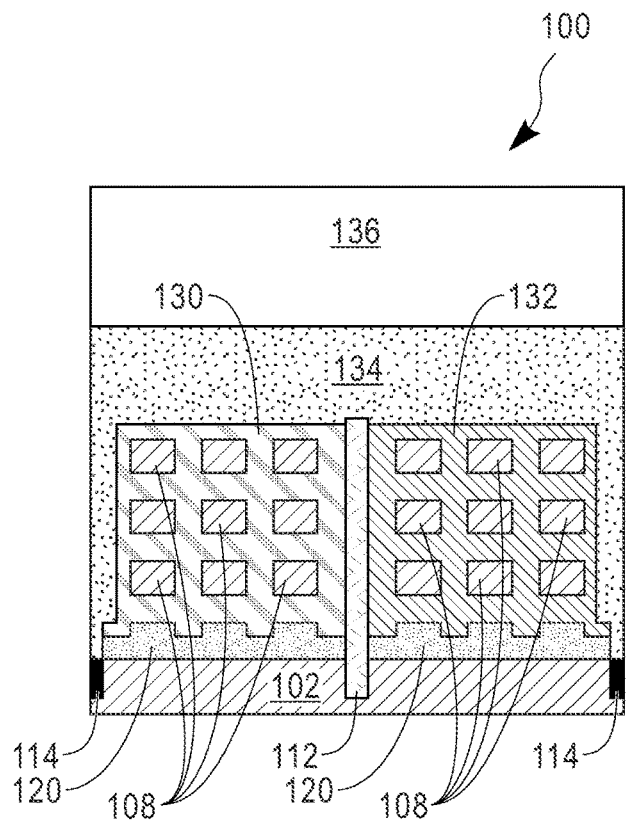
Figure 14C:
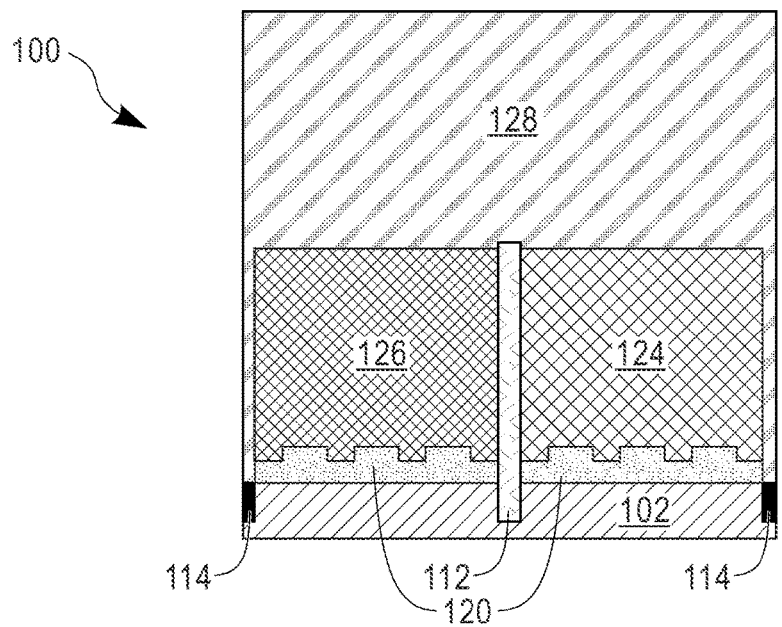

FIGS. 14A-14C depict the GAA nanosheet matrix-FET 100 after formation of the nFET WFM 132, the pFET WFM 140, a metal gate layer 134, and a self-aligned contact (SAC) cap 136. In particular, the nFET WFM 132 and pFET WFM 140 are formed in the gaps where the low-Ge % SiGe layers 106 previously were (i.e., between the Si layers 108 and between the bottom Si layer 108 and the BDI 120), as well as on top of the top Si Layer 108. This is shown in FIGS. 14A and 14B. Additionally, the nFET WFM 132 and pFET WFM 140 are formed in the gate channels in their respective regions, as shown in FIG. 14A. The nFET WFM 132 and pFET WFM 140 may be the same or different WFMs, as would be apparent to one of ordinary skill in the art.

The metal gate layer 134 is formed on top of and around the nFET WFM 132 and pFET WFM 140 in the gate areas, as shown in FIGS. 14A and 14B. The metal gate layer 134 may be any suitable gate material, including, for example, tungsten. A SAC cap 136 is formed on top of the metal gate layer 134. The SAC cap 136 is a dielectric layer that helps self-align the trench metal contact in-between the gates during the RIE process, and it may prevent the gates from contacting other components and contact-to-gate shorting. While embodiments of the present disclosure are described as including a SAC cap, some embodiments may not have a SAC cap. Instead, embodiments of the present disclosure may involve a non-SAC fabrication process.

Figure 15A:
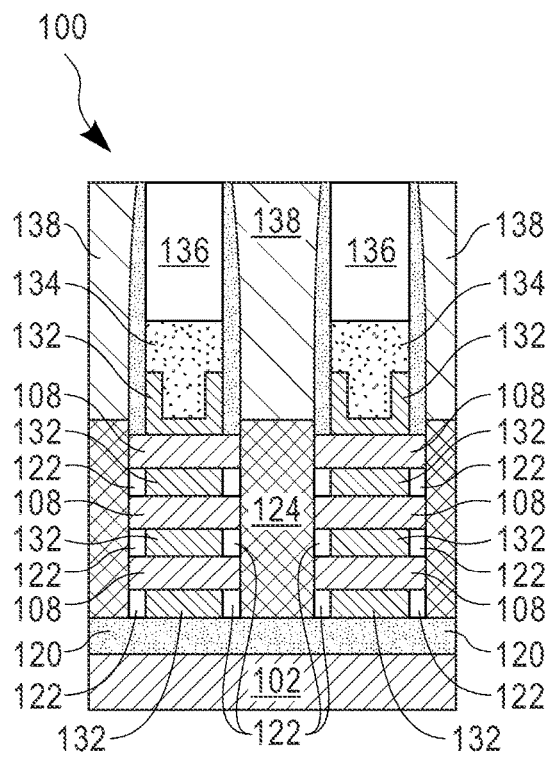
FIGS. 15A-C are cross-sectional views depicting the semiconductor structure of FIGS. 14A-C after one or more additional fabrication operations, in accordance with embodiments of the present disclosure.
Figure 15B:
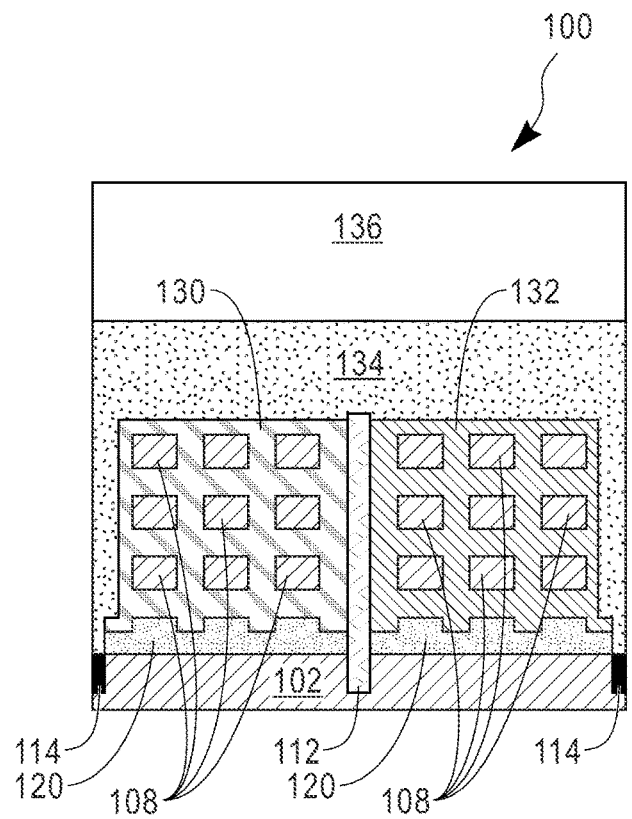
Figure 15C:
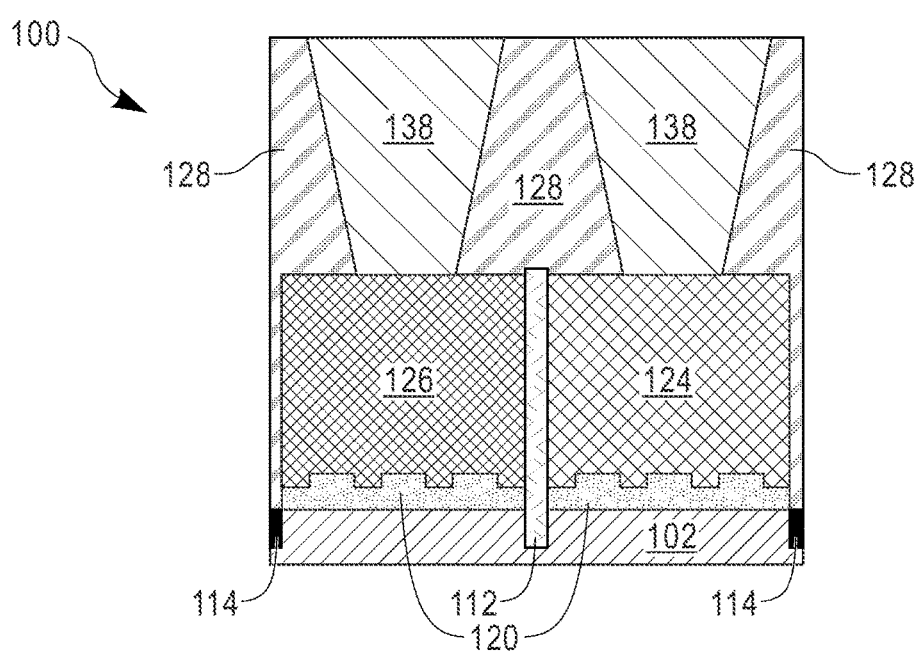

FIGS. 15A-15C depict the GAA nanosheet matrix-FET 100 after trench contact formation. In particular, FIGS. 15A-15C depict trench contact formation in the case of a shared gate device (i.e., one where the pFET and nFET regions share a gate). As shown in FIGS. 15A-15C, portions of the ILD material 128 are replaced with trench contacts 138, which are made of a conductive material such as a metal. The trench contacts 138 extend from the top of the GAA nanosheet matrix-FET 100 down to the nFET source/drain epitaxy 124 and pFET source/drain epitaxy 126. The trench contacts 138 are isolated from the gates by the SAC cap 136 and the gate spacers on the sidewalls of the gates. As shown in FIG. 15A, the gate spaces may be made out of the same material as the BDI layer 120, but this is not a requirement.

Figure 16A:
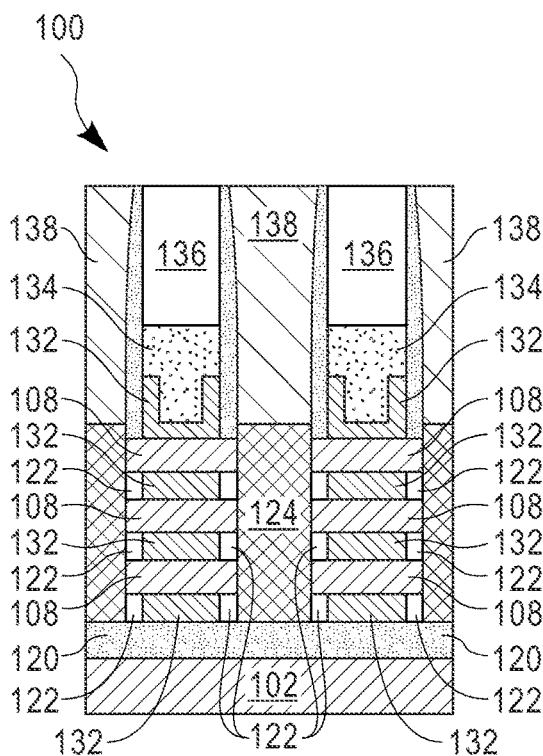
FIGS. 16A-C are cross-sectional views depicting the semiconductor structure of FIGS. 14A-C after one or more additional fabrication operations, in accordance with embodiments of the present disclosure.
Figure 16B:
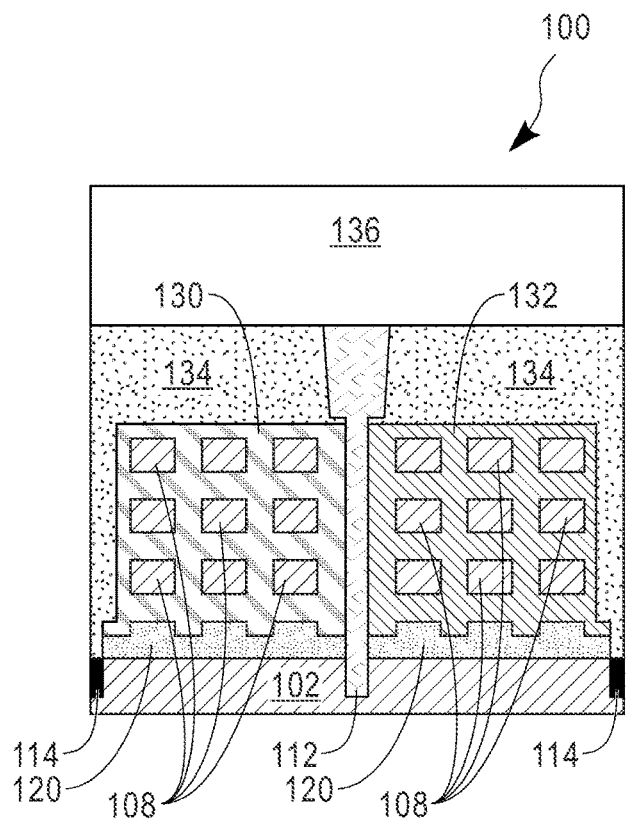
Figure 16C:
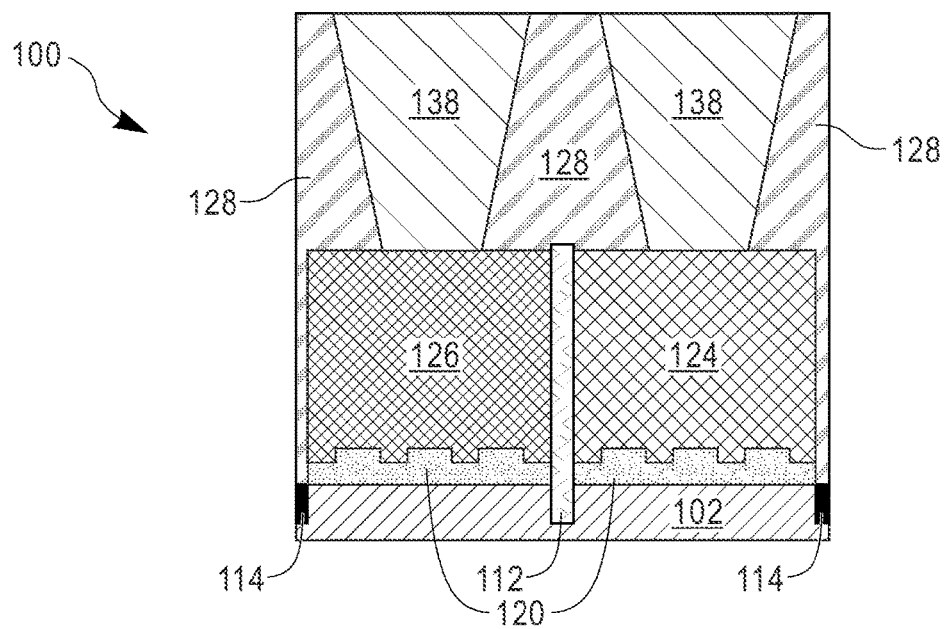

FIGS. 16A-16C depict the GAA nanosheet matrix-FET 100 after trench contact formation. In particular, FIGS. 16A-16C depict trench contact formation in the case of an isolated gate device (i.e., one where the pFET and nFET regions do not share a gate). The GAA nanosheet matrix-FET 100 is substantially similar to the one shown in FIGS. 15A-15C except that the metal gate layer 134 is broken up by the dielectric pillar 112, as can be seen in FIG. 16B. This can be done by forming a dielectric extension up from the original dielectric pillar 112 to disconnect the p-gates from the n-gates.

The descriptions of the various embodiments of the present disclosure have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A gate-all-around (GAA) nanowire matrix transistor comprising:
    a substrate;
    a bottom dielectric isolation (BDI) layer on top of the substrate;
    a pFET region including a p-doped Source-Drain epitaxy material and a first nanowire matrix above the BDI layer, the first nanowire matrix comprising a plurality of Si nanowires surrounded by a first gate work function metal stack, the first nanowire matrix being an m-by-n matrix where both m and n are integers greater than 1;
    an nFET region including a n-doped Source-Drain epitaxy material and a second nanowire matrix above the BDI layer, the second nanowire matrix comprising a plurality of Si nanowires surrounded by a second gate work function metal stack, the second nanowire matrix being an x-by-y matrix where both x and y are integers greater than 1;
    a conductive gate material on top of a portion of the first nanowire matrix and the second nanowire matrix;
    a vertical dielectric pillar separating the pFET region and the nFET region, wherein the vertical dielectric pillar extends downward through the BDI layer into the substrate, and wherein the vertical dielectric pillar extends upward through the conductive gate material to a dielectric located above a gate region; and
    wherein the BDI layer has a first thickness in areas directly below the nanowires and a second thickness in areas below gaps between nanowires in the same nanowire matrix, wherein the second thickness is smaller than the first thickness.

2. The GAA nanowire transistor of claim 1, wherein the conductive gate material is aligned on top of Si nanowires.

3. The GAA nanowire transistor of claim 1, wherein a difference between a vertical distance between the nanowires and a horizontal distance between the nanowires is less than or equal to 2 nm.

4. The GAA nanowire transistor of claim 1, further comprising:
    a first contact on top of the p-doped Source-Drain epitaxy material, wherein the first contact extends vertically away from the p-doped Source-Drain epitaxy material; and
    a second contact on top of the n-doped Source-Drain epitaxy material, wherein the second contact extends vertically away from the n-doped Source-Drain epitaxy material,
    wherein one of the first and second contacts is a source contact and the other of the first and second contacts is a drain contact.

5. The GAA nanowire transistor of claim 1, wherein:
    a vertical distance between nanowires and a horizontal distance between nanowires are approximately 11 nm;
    a vertical thickness of the Si nanowires is approximately 5 nm; and
    a width of the Si nanowires is between approximately 10 nm and 25 nm.

6. The GAA nanowire transistor of claim 1, further comprising:
    a self-aligned contact (SAC) cap on top of the conductive gate material;
    a first shallow trench isolation (STI) layer formed in the substrate at an end of the pFET region opposite the dielectric pillar; and
    a second STI layer formed in the substrate at an end of the nFET region opposite the dielectric pillar.

7. A gate-all-around (GAA) nanowire matrix transistor comprising:
    a substrate;
    a bottom dielectric isolation (BDI) layer on top of the substrate;
    a pFET region including a p-doped Source-Drain epitaxy material and a first nanowire matrix above the BDI layer, the first nanowire matrix comprising a plurality of Si nanowires surrounded by a first gate work function metal stack, the first nanowire matrix being an m-by-n matrix where both m and n are integers greater than 1;
    an nFET region including a n-doped Source-Drain epitaxy material and a second nanowire matrix above the BDI layer, the second nanowire matrix comprising a plurality of Si nanowires surrounded by a second gate work function metal stack, the second nanowire matrix being an x-by-y matrix where both x and y are integers greater than 1;

a conductive gate material on top of a portion of the first nanowire matrix and the second nanowire matrix;

a vertical dielectric pillar separating the pFET region and the nFET region, wherein the vertical dielectric pillar extends downward through the BDI layer into the substrate, and wherein the vertical dielectric pillar extends upward to a bottom of the conductive gate material; and wherein the BDI layer has a first thickness in areas directly below the nanowires and a second thickness in areas below gaps between the nanowires, wherein the second thickness is smaller than the first thickness.

8. The GAA nanowire transistor of claim 7, wherein the conductive gate material is aligned on top of Si nanowires.

9. The GAA nanowire transistor of claim 7, wherein a difference between a vertical distance between nanowires and a horizontal distance between nanowires is less than or equal to 2 nm.

10. The GAA nanowire transistor of claim 7, further comprising:
a first contact on top of the p-doped Source-Drain epitaxy material, wherein the first contact extends vertically away from the p-doped Source-Drain epitaxy material; and
a second contact on top of the n-doped Source-Drain epitaxy material, wherein the second contact extends vertically away from the n-doped Source-Drain epitaxy material,
wherein one of the first and second contacts is a source contact and the other of the first and second contacts is a drain contact.

11. The GAA nanowire transistor of claim 7, wherein:
a vertical distance between nanowires and a horizontal distance between nanowires are approximately 11 nm;
a vertical thickness of the Si nanowires is approximately 5 nm; and
a width of the Si nanowires is between approximately 10 nm and 25 nm.

12. The GAA nanowire transistor of claim 7, further comprising:
a first shallow trench isolation (STI) layer formed in the substrate at an end of the pFET region opposite the dielectric pillar; and
a second STI layer formed in the substrate at an end of the nFET region opposite the dielectric pillar.

13. The GAA nanowire transistor of claim 7, further comprising:
a self-aligned contact (SAC) cap on top of the conductive gate material.

14. A method for fabricating a semiconductor device, the method comprising:
forming an m-by-n nanosheet matrix, the nanosheet matrix having at least two nanowires per dimension in each of a pFET region and an nFET region;
forming a dielectric pillar between the pFET region and the nFET region, wherein the dielectric pillar extends into a substrate;
forming a bottom dielectric isolation (BDI) layer between the substrate and the nanosheet matrix, wherein the BDI layer has a first thickness in areas directly below the nanowires and a second thickness in areas below gaps between the nanowires, wherein the second thickness is smaller than the first thickness;
forming one or more gates on top of the nanosheet matrix and the dielectric pillar, wherein the one or more gates define a gate region, and wherein the dielectric pillar is in both the gate region and a source/drain region of the semiconductor device; and
forming a first top contact on top of a pFET source/drain epitaxy and a second top contact on top of an nFET source/drain epitaxy, wherein the pFET source/drain epitaxy and the nFET source/drain epitaxy are formed in the source/drain region.

15. The method of claim 14, the method further comprising forming a self-aligned contact (SAC) cap on top of the one or more gates.

16. The method of claim 14, wherein the dielectric pillar electrically isolates the pFET region and the nFET region.

17. The method of claim 14, wherein forming the m-by-n nanosheet matrix comprises:
forming a nanosheet stack epitaxy with alternating layers of Si and a sacrificial material;
patterning one or more fins into the nanosheet stack epitaxy, wherein a distance between fins is approximately the same as a distance between layers of Si;
etching the fins such that the Si layers are removed from areas that are not below the one or more gates;
removing the sacrificial material; and
depositing one or more gate work function metals between and around the Si layers that are below the one or more gates.

* * * * *